US009885767B2

(12) United States Patent
Tsujita et al.

(10) Patent No.: US 9,885,767 B2
(45) Date of Patent: Feb. 6, 2018

(54) MAGNETIC RESONANCE IMAGING APPARATUS

(71) Applicant: TOSHIBA MEDICAL SYSTEMS CORPORATION, Otawara-shi, Tochigi (JP)

(72) Inventors: Kazuhiko Tsujita, Otawara Tochigi (JP); Hiromitsu Takamori, Otawara Tochigi (JP)

(73) Assignee: TOSHIBA MEDICAL SYSTEMS CORPORATION, Otawara-Shi, Tochigi-Ken (JP)

(*) Notice: Subject to any disclaimer, the term of this patent is extended or adjusted under 35 U.S.C. 154(b) by 478 days.

(21) Appl. No.: 14/537,329

(22) Filed: Nov. 10, 2014

(65) Prior Publication Data
US 2015/0061677 A1 Mar. 5, 2015

Related U.S. Application Data

(63) Continuation of application No. PCT/JP2013/063175, filed on May 10, 2013.

(30) Foreign Application Priority Data

May 10, 2012 (JP) ................... 2012-108775

(51) Int. Cl.
G01V 3/00 (2006.01)
G01R 33/385 (2006.01)
(52) U.S. Cl.
CPC ..... G01R 33/3854 (2013.01); G01R 33/3858 (2013.01)

(58) Field of Classification Search
CPC .................................................. G01R 33/3854
(Continued)

(56) References Cited

U.S. PATENT DOCUMENTS 4,639,672 A 1/1987 Beaumont
6,043,653 A 3/2000 Takamori et al.
(Continued)

FOREIGN PATENT DOCUMENTS

JP 60-100954 6/1985
JP 1-194307 8/1989
(Continued)

OTHER PUBLICATIONS

International Search Report for PCT/JP2013/063175, dated Jun. 4, 2013.

Primary Examiner — Louis Arana
(74) Attorney, Agent, or Firm — Nixon & Vanderhye P.C.

(57) ABSTRACT

A magnetic resonance imaging apparatus includes: a magnetostatic field magnet that is formed in the shape of a cylinder and generates a magnetostatic field in a space inside the cylinder; a gradient coil that is formed in the shape of a cylinder, is disposed in the cylinder of the magnetostatic field magnet, and applies a gradient magnetic field to the magnetostatic field; a bore tube that is formed in the shape of a cylinder and is disposed in the cylinder of the gradient coil; and an elastic member that is loop-shaped and hollow, is disposed in at least one selected from: a space between an inner circumferential side of the magnetostatic field magnet and an outer circumferential side of the gradient coil; and a space between an inner circumferential side of the gradient coil and an outer circumferential side of the bore tube, and thereby seals the space hermetically.

5 Claims, 10 Drawing Sheets

(58) Field of Classification Search
USPC .................................................. 324/318, 322
See application file for complete search history.

(56) References Cited

U.S. PATENT DOCUMENTS

2004/0061499 A1* 4/2004 Stocker .............. G01R 33/3854
324/318
2013/0314089 A1 11/2013 Katsunuma et al.
2016/0216349 A1* 7/2016 Takamori ........... G01R 33/3854

FOREIGN PATENT DOCUMENTS

JP     10-1180430     5/1998
JP     2005-245775    9/2005
WO     WO 2012/96380  7/2002

* cited by examiner

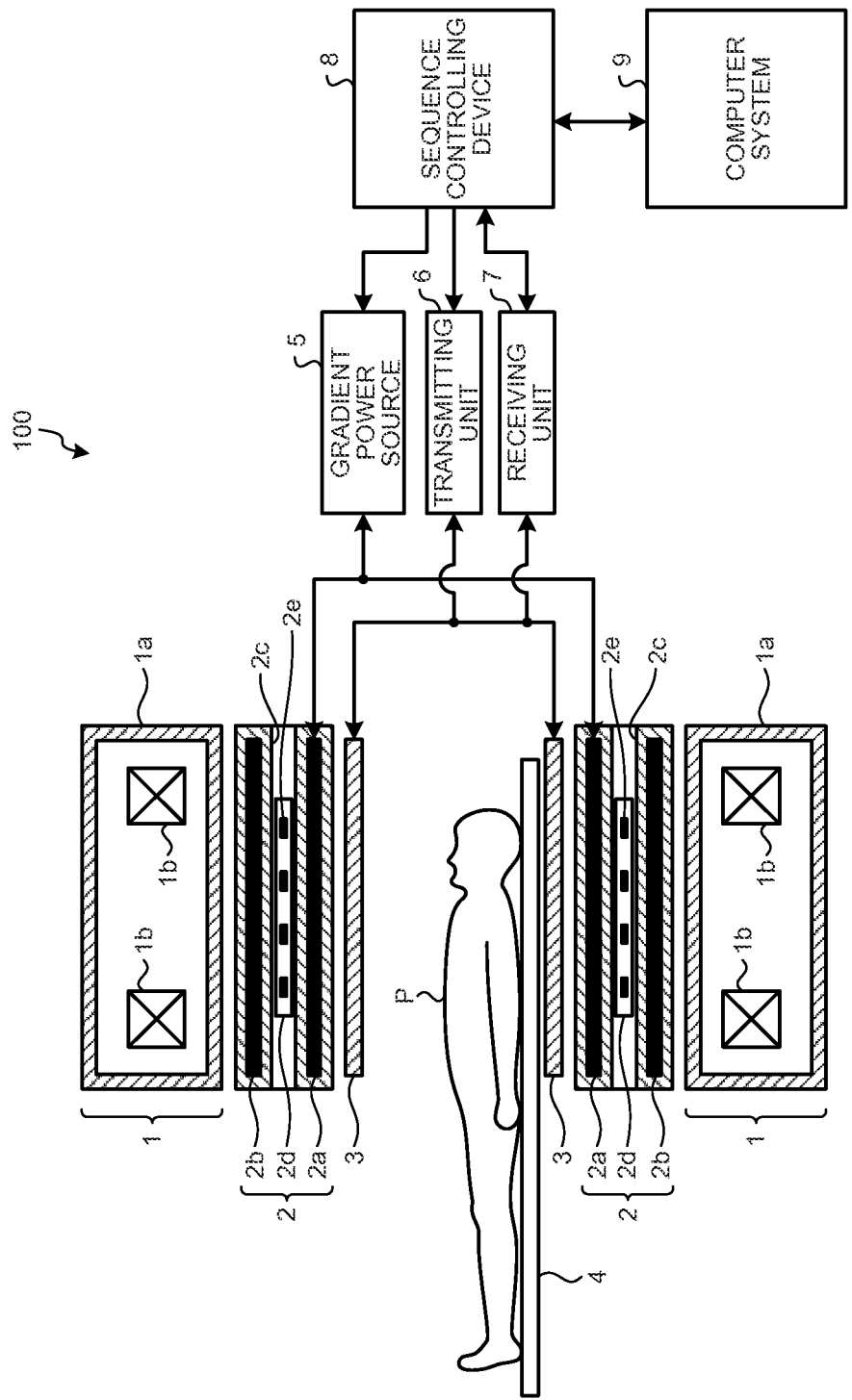

MAGNETIC RESONANCE IMAGING APPARATUS

CROSS-REFERENCE TO RELATED APPLICATIONS

This application is a continuation of PCT international application Ser. No. PCT/JP2013/063175 filed on May 10, 2013 which designates the United States, incorporated herein by reference, and which claims the benefit of priority from Japanese Patent Application No. 2012-108775, filed on May 10, 2012, the entire contents of which are incorporated herein by reference.

FIELD

Embodiments described herein relate generally to a magnetic resonance imaging apparatus.

BACKGROUND

Conventionally, a silencing technique for reducing noise from vibrations of a gradient coil in a magnetic resonance imaging apparatus is known by which the entirety of the gradient coil is disposed in a vacuum space. According to the silencing technique, for example, a hermetically-sealed container is formed in the surroundings of the gradient coil disposed between a magnetostatic field magnet and a bore tube, by fixing a hermetically-sealing cover to each of the lateral ends of the magnetostatic field magnet and the bore tube that are each formed in the shape of a circular cylinder. Further, the vacuum space is formed in the surroundings of the gradient coil by discharging the air in the hermetically-sealed container by using a vacuum pump. According to the conventional technique described above, however, there is a certain limit to the silencing capability.

BRIEF DESCRIPTION OF THE DRAWINGS

FIG. 1 is a diagram to illustrate an overall configuration of a magnetic resonance imaging apparatus according to a first embodiment;

DETAILED DESCRIPTION

Figure 2A:
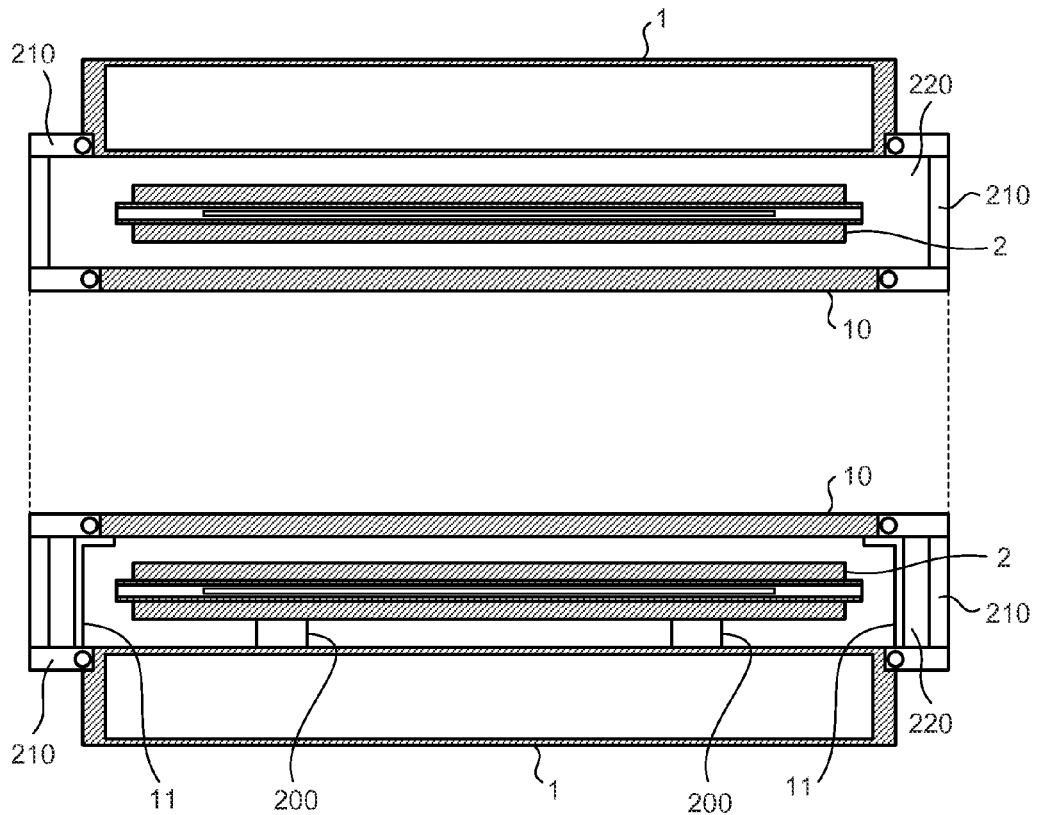
FIG. 2A is a first drawing for explaining problems with a conventional technique.

According to embodiment, a magnetic resonance imaging apparatus comprising, a magnetostatic field magnet, a gradient coil, a bore tube and an elastic member. The magnetostatic field magnet that is formed in a shape of a cylinder and generates a magnetostatic field in a space inside the cylinder. The gradient coil that is formed in a shape of a cylinder, is disposed in the cylinder of the magnetostatic field magnet, and applies a gradient magnetic field to the magnetostatic field. The bore tube that is formed in a shape of a cylinder and is disposed in the cylinder of the gradient coil. The elastic member that is loop-shaped and hollow, is disposed in at least one selected from: a space between an inner circumferential side of the magnetostatic field magnet and an outer circumferential side of the gradient coil; and a space between an inner circumferential side of the gradient coil and an outer circumferential side of the bore tube, and thereby seals the space hermetically.

FIG. 1 is a diagram to illustrate an overall configuration of a magnetic resonance imaging apparatus 100 according to a first embodiment. In the following sections, magnetic resonance imaging apparatuses will be referred to as MRI apparatuses.

As illustrated in FIG. 1, the MRI apparatus 100 includes a magnetostatic field magnet 1, a gradient coil 2, a Radio Frequency (RF) coil 3, a couchtop 4, a gradient power source 5, a transmitting unit 6, a receiving unit 7, a sequence controlling device 8, and a computer system 9.

The magnetostatic field magnet 1 is formed in the shape of a cylinder and is configured to generate a magnetostatic field in the space inside the cylinder. For example, the magnetostatic field magnet 1 is formed in the shape of a substantially circular cylinder and is configured to generate the magnetostatic field in the space inside the circular cylinder. In an example, the magnetostatic field magnet 1 includes a vacuum container $1a$ that is in the shape of a substantially circular cylinder and superconductive coils $1b$ that is impregnated with cooling liquid within the vacuum container $1a$. The magnetostatic field magnet 1 is configured to generate the magnetostatic field in a bore (the space inside the circular cylinder of the magnetostatic field magnet 1), which serves as an image taking region.

The gradient coil 2 is formed in the shape of a cylinder, is disposed in the cylinder of the magnetostatic field magnet 1, and is configured to apply a gradient magnetic field to the magnetostatic field. For example, the gradient coil 2 is formed in the shape of a substantially circular cylinder, is disposed in the circular cylinder of the magnetostatic field magnet 1, and is configured to apply the gradient magnetic field to the magnetostatic field. In an example, the gradient coil 2 is configured by using an Active Shield Gradient Coil (ASGC) that includes a main coil 2a and a shield coil 2b. The main coil 2a is configured to apply the gradient magnetic field in the directions along the X-axis, the Y-axis, and the Z-axis by using electric current supplied from the gradient power source 5. The shield coil 2b is configured to generate a magnetic field that cancels out a leakage magnetic field of the main coil 2a.

In this situation, a shim tray insertion guide 2c is provided between the main coil 2a and the shield coil 2b. The shim tray insertion guide 2c is configured to have a shim tray 2d inserted therein, the shim tray 2d storing therein iron shims 2e used for correcting inhomogeneity of the magnetic field generated on the inside of the bore. The gradient coil 2 illustrated in FIG. 1 is merely an example, and possible embodiments are not limited to this example.

The RF coil 3 is fixed to the inside of the gradient coil 2 in such a manner that sections thereof face each other while an examined subject (hereinafter, a "subject") P is interposed therebetween. The RF coil 3 is configured to radiate an RF pulse transmitted from the transmitting unit 6 onto the subject P and to receive magnetic resonance signals that are emitted from the subject P due to excitation of hydrogen nuclei.

The couchtop 4 is provided on a couch (not shown) so as to be movable in horizontal directions. When an image taking process is to be performed, the couchtop 4 is moved into the bore while the subject is placed thereon. The gradient power source 5 is configured to supply the electric current to the gradient coil 2 on the basis of an instruction from the sequence controlling device 8.

The transmitting unit 6 is configured to transmit the RF pulse to the RF coil 3 on the basis of an instruction from the sequence controlling device 8. The receiving unit 7 is configured to detect the magnetic resonance signals received by the RF coil 3 and to transmit raw data obtained by digitalizing the detected magnetic resonance signals, to the sequence controlling device 8. The receiving unit 7 may be provided on the gantry device side where the magnetostatic field magnet 1, the gradient coil 2, and the like are provided.

The sequence controlling device 8 is configured to perform an image taking process on the subject P, by driving the gradient power source 5, the transmitting unit 6, and the receiving unit 7, under control of the computer system 9. Further, when the raw data is transmitted thereto from the receiving unit 7 as a result of the image taking process, the sequence controlling device 8 transmits the raw data to the computer system 9.

The computer system 9 is configured to control the entirety of the MRI apparatus 100. More specifically, the computer system 9 includes: an input unit configured to receive various types of inputs from an operator; a sequence controlling unit configured to cause the sequence controlling device 8 to execute the image taking process on the basis of an image taking condition input by the operator; an image reconstructing unit configured to reconstruct an image on the basis of the raw data transmitted from the sequence controlling device 8; a storage unit configured to store therein the reconstructed image and the like; a display unit configured to display various types of information such as the reconstructed image; and a main controlling unit configured to control operations of functional units on the basis of an instruction from the operator.

An overall configuration of the MRI apparatus 100 according to the first embodiment has thus been explained. With a configuration explained in detail below, the MRI apparatus 100 according to the first embodiment makes it possible to improve the silencing capability, which has a certain limit according to the conventional technique. Next, the silencing capability according to the conventional technique will be explained at first. As mentioned above, as the conventional technique, the silencing technique for reducing the noise from the vibrations of a gradient coil is known by which the entirety of the gradient coil is disposed in a vacuum space.

FIG. 2A is a first drawing for explaining problems with the conventional technique. FIG. 2A is a cross-sectional view of the magnetostatic field magnet 1, the gradient coil 2, and a bore tube 10, which is not shown in FIG. 1. As for the gradient coil 2, a cross-sectional view thereof at a position where the shim tray insertion guide is provided is shown in FIG. 2A. As for the magnetostatic field magnet 1, only the outside framework thereof is shown in FIG. 2A.

As illustrated in FIG. 2A, the bore tube 10 is disposed in the circular cylinder of the gradient coil 2. The bore tube 10 is formed in the shape of a substantially circular cylinder and forms, within the circular cylinder, a space in which the subject is placed. Further, the bore tube 10 is configured to prevent the subject who is placed inside the circular cylinder from being in contact with the gradient coil 2. Further, as illustrated in FIG. 2A, a bore tube supporting unit 11 of which one end is fixed to the magnetostatic field magnet 1 and of which the other end supports the bore tube 10 is provided.

According to the conventional technique, as illustrated in FIG. 2A for example, the gradient coil 2 is supported by a gradient coil supporting unit 200 provided on the inner circumferential surface of the magnetostatic field magnet 1, in such a manner that the gradient coil 2 is held in a position away from the inner circumferential surface of the magnetostatic field magnet 1 by a predetermined distance. Further, according to the conventional technique, as illustrated in FIG. 2A for example, a hermetically-sealed container is formed in the surroundings of the gradient coil 2 that is disposed between the inner circumferential side of the magnetostatic field magnet 1 and the outer circumferential side of the bore tube 10, by fixing both ends of the magnetostatic field magnet 1 and the bore tube 10, each of which is formed in the shape of a circular cylinder, to end plates 210. Further, by discharging the air inside the hermetically-sealed container by using a vacuum pump (not shown), a vacuum space 220 is formed in the surroundings of the gradient coil 2.

Figure 2B:
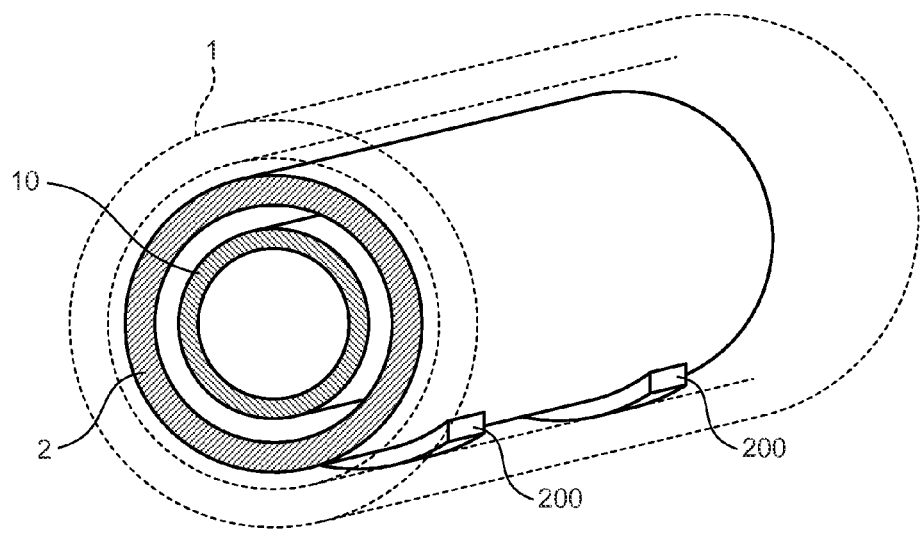
FIG. 2B is a second drawing for explaining the problems with the conventional technique.

As a result, according to the conventional technique, it is possible to eliminate the propagation of noise through the air, the noise being generated due to the vibrations of the gradient coil 2. It is therefore possible reduce the noise during medical examinations. According to the conventional technique, however, although it is possible to eliminate the propagation of the noise through the air, it is not possible to eliminate the propagation of the noise through solids. More specifically, because the hermetically-sealed container itself in which the gradient coil 2 is disposed serves as a medium of the propagation of the vibrations through the solids, it is not possible to reduce the noise. FIG. 2B is a second drawing for explaining the problems with the conventional technique. FIG. 2B is a perspective view of the magnetostatic field magnet 1, the gradient coil 2, and the bore tube 10 according to the conventional technique. Although the end plates 210 are not shown in FIG. 2B, both ends of the magnetostatic field magnet 1 and the bore tube 10 are fixed by the end plates 210 in actuality.

As illustrated in FIG. 2B, the magnetostatic field magnet 1, the gradient coil 2, and the bore tube 10 are each formed in the shape of a substantially circular cylinder. Further, according to the conventional technique, the gradient coil 2 is supported by the gradient coil supporting unit 200 provided on a part of the inner circumferential surface of the magnetostatic field magnet 1. In this situation, when the gradient coil 2 is vibrated, the vibrations are propagated to the magnetostatic field magnet 1 via the gradient coil supporting unit 200. Further, the vibrations propagated to the magnetostatic field magnet 1 are propagated to the bore tube 10 via the bore tube supporting unit 11. As a result, the vibrations propagated to the bore tube 10 become a source of the noise.

As explained above, according to the conventional technique, because it is not possible to eliminate the noise caused by the propagation of vibrations through the solids, there is a certain limit to the silencing capability. In addition, according to the conventional technique, because both ends of the magnetostatic field magnet 1 and the bore tube 10 are fixed to the end plates 210, the gantry tends to be long, which impedes the feeling of openness for the subject.

To cope with this situation, it is an object of the MRI apparatus 100 according to the first embodiment to improve the silencing capability and to enhance the feeling of openness for the subject. The MRI apparatus 100 according to the first embodiment is configured so that a first elastic member that is loop-shaped and hollow is disposed in at least one selected from: the space between the inner circumferential side of the magnetostatic field magnet 1 and the outer circumferential side of the gradient coil 2; and the space between the inner circumferential side of the gradient coil 2 and the outer circumferential side of the bore tube 10, and is configured to thereby seal the space hermetically. For example, the first elastic member is annular-shaped and hollow and is configured to seal the space hermetically.

Figure 3A:
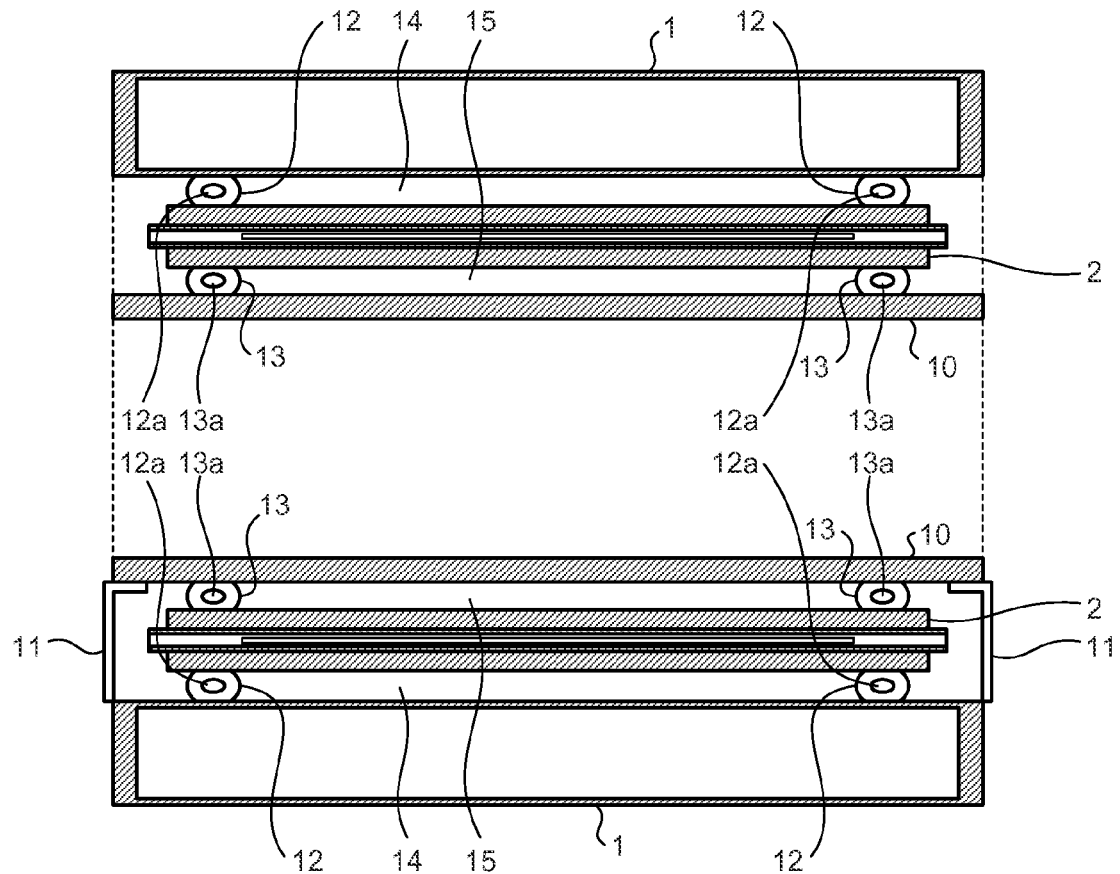
FIG. 3A is a cross-sectional view to illustrate structures of a magnetostatic field magnet, a gradient coil, and a bore tube according to the first embodiment.

FIG. 3A is a cross-sectional view to illustrate structures of the magnetostatic field magnet 1, the gradient coil 2, and the bore tube 10 according to the first embodiment. As illustrated in FIG. 3A, in the MRI apparatus 100 according to the first embodiment, elastic members 12 are disposed in the space between the inner circumferential side of the magnetostatic field magnet 1 and the outer circumferential side of the gradient coil 2. In this situation, as illustrated in FIG. 3A, each of the elastic members 12 has a hollow 12*a*. The elastic members 12 form a hermetically-sealed space 14 by being disposed at both ends of the magnetostatic field magnet 1 and the gradient coil 2.

Similarly, in the MRI apparatus 100 according to the first embodiment, elastic members 13 are disposed in the space between the inner circumferential side of the gradient coil 2 and the outer circumferential side of the bore tube 10. In this situation, as illustrated in FIG. 3A, each of the elastic members 13 has a hollow 13*a*. The elastic members 13 form a hermetically-sealed space 15, by being disposed at both ends of the gradient coil 2 and the bore tube 10.

The elastic members 12 and the elastic members 13 may be configured by using any material, as long as the material has flexibility. For example, rings made of rubber may be used. Further, liquid such as water or oil or gas such as air or any other type of gas is put into the hollows 12*a* and 13*a* of the elastic members 12 and 13, and a predetermined level of internal pressure is applied thereto. By changing the internal pressures, it is possible to arbitrarily change the hardness of each of the elastic members 12 and 13. In other words, the MRI apparatus 100 according to the first embodiment is configured so as to be able to increase the degree by which each of the elastic members 12 is in close contact with the magnetostatic field magnet 1 and the gradient coil 2. It is therefore possible to improve the sealing capability. Similarly, the MRI apparatus 100 according to the first embodiment is configured so as to be able to increase the degree by which each of the elastic members 13 is in close contact with the gradient coil 2 and the bore tube 10. It is therefore possible to improve the sealing capability.

Figure 3B:
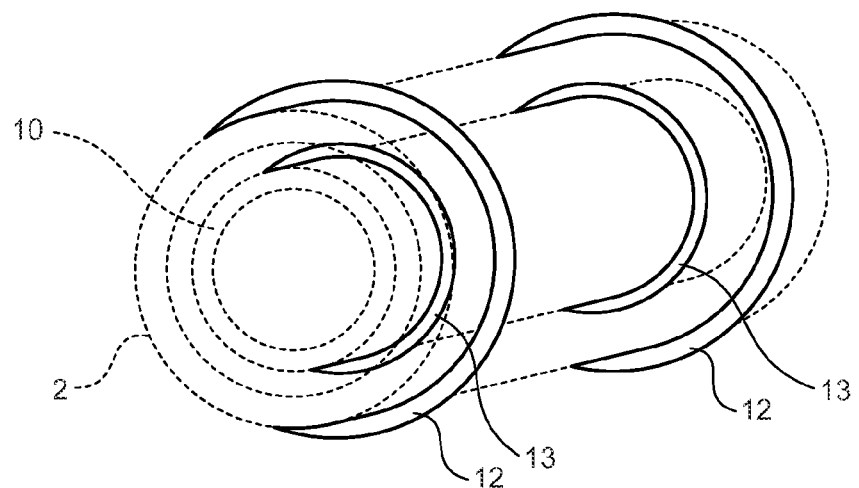
FIG. 3B is a perspective view of the gradient coil and the bore tube according to the first embodiment.

Further, the MRI apparatus 100 according to the first embodiment is configured so that the elastic members 12 and the elastic members 13 described above are disposed so as to be in close contact with the outer circumferential side and the inner circumferential side of the gradient coil 2. FIG. 3B is a perspective view of the gradient coil 2 and the bore tube 10 according to the first embodiment. As illustrated in FIG. 3B, the MRI apparatus 100 according to the first embodiment is configured so that the elastic members 12 each of which is annular-shaped are disposed on the outer circumferential side of the gradient coil 2 at the two ends thereof. In addition, the MRI apparatus 100 according to the first embodiment is configured so that the elastic members 13 each of which is annular-shaped are disposed on the inner circumferential side of the gradient coil 2 at the two ends thereof.

As explained above, the annular-shaped elastic members 12 and 13 of which the strengths can arbitrarily be adjusted by changing the internal pressures in the hollows thereof are disposed on the outer circumferential side and the inner circumferential side of the gradient coil 2 that is a source of the vibrations. Consequently, the MRI apparatus 100 according to the first embodiment is able to reduce the propagation of the vibrations through the solids. Further, because the hermetically-sealed spaces 14 and 15 are each made into a vacuum by the vacuum pump (not shown in FIG. 3A), the MRI apparatus 100 according to the first embodiment is able to eliminate the propagation of the vibrations through the air. It should be noted that the "vacuum" mentioned herein includes a low-pressure state being close to a vacuum. Further, the MRI apparatus 100 according to the first embodiment is able to form the hermetically-sealed spaces without using any end plates and is able to make each of the spaces into a vacuum. Consequently, it is possible to shorten the length of the gantry and to enhance the feeling of openness for the subject.

Figure 4A:
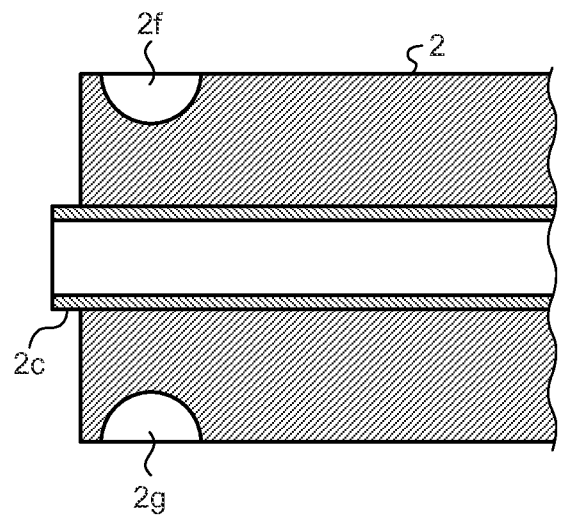
FIG. 4A is a first cross-sectional view to illustrate a shape of the gradient coil near a lateral end thereof according to the first embodiment.
Figure 4B:
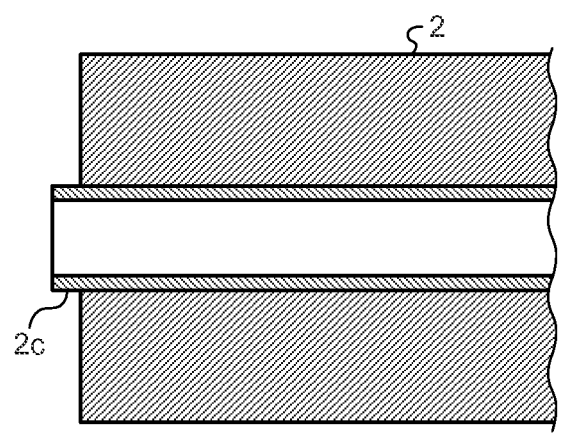
FIG. 4B is a second cross-sectional view to illustrate another shape of the gradient coil near a lateral end thereof according to the first embodiment.

Next, the shape of the gradient coil 2 near the lateral ends thereof will be explained, with reference to FIGS. 4A and 4B. FIG. 4A is a first cross-sectional view to illustrate a shape of the gradient coil 2 near a lateral end thereof according to the first embodiment. FIG. 4B is a second cross-sectional view to illustrate another shape of the gradient coil 2 near a lateral end thereof according to the first embodiment. FIGS. 4A and 4B each illustrate a shape of the gradient coil 2 near a lateral end thereof, the gradient coil 2 being shown at the upper section of FIG. 3A.

First, a shape of the gradient coil 2 in a situation where the hermetically-sealed spaces 14 and 15 are each made into a vacuum will be explained. When the hermetically-sealed spaces 14 and 15 are each made into a vacuum, as illustrated in FIG. 4A for example, grooves 2*f* are formed in the gradient coil 2 in such parts against which the elastic members 12 abut, whereas grooves 2*g* are formed in the gradient coil 2 in such parts against which the elastic members 13 abut. As a result, the ends of the elastic members 12 positioned on the gradient coil 2 side engage with the grooves 2*f*, whereas the ends of the elastic members 13 positioned on the gradient coil 2 side engage with the grooves 2g. Consequently, even if the air inside the hermetically-sealed space 14 is sucked out by the vacuum pump in order to make the hermetically-sealed space 14 into a vacuum, for example, it is possible to prevent the elastic members 12 from being drawn to the center of the hermetically-sealed space 14 due to a decrease in the pressure inside the hermetically-sealed space 14. Similarly, it is possible to prevent the elastic members 13 from being drawn to the center of the hermetically-sealed space 15 due to a decrease in the pressure inside the hermetically-sealed space 15.

In contrast, when the hermetically-sealed spaces 14 and 15 each are not made into a vacuum, it is not necessary to provide the gradient coil 2 with the grooves 2f and 2g. In other words, as illustrated in FIG. 4B, the gradient coil 2 may be shaped even in the parts near the lateral ends thereof. Even with this configuration, it is possible to reduce the noise from the gradient coil 2 because the gradient coil 2 is disposed in the hermetically-sealed space.

In this situation, the lateral ends of the gradient coil 2 are positioned on the outside of the hermetically-sealed spaces 14 and 15 of which the boundaries are defined by the elastic members 12 and 13. As a result, the lateral ends of the gradient coil 2 are exposed to the air. However, because the lateral ends of the gradient coil 2 are smaller in the area than the outer circumferential part and the inner circumferential part thereof, the acoustic emission from the lateral ends thereof are smaller. Consequently, an increase in the noise caused by having the lateral ends of the gradient coil 2 exposed in the air is small.

Figure 5:
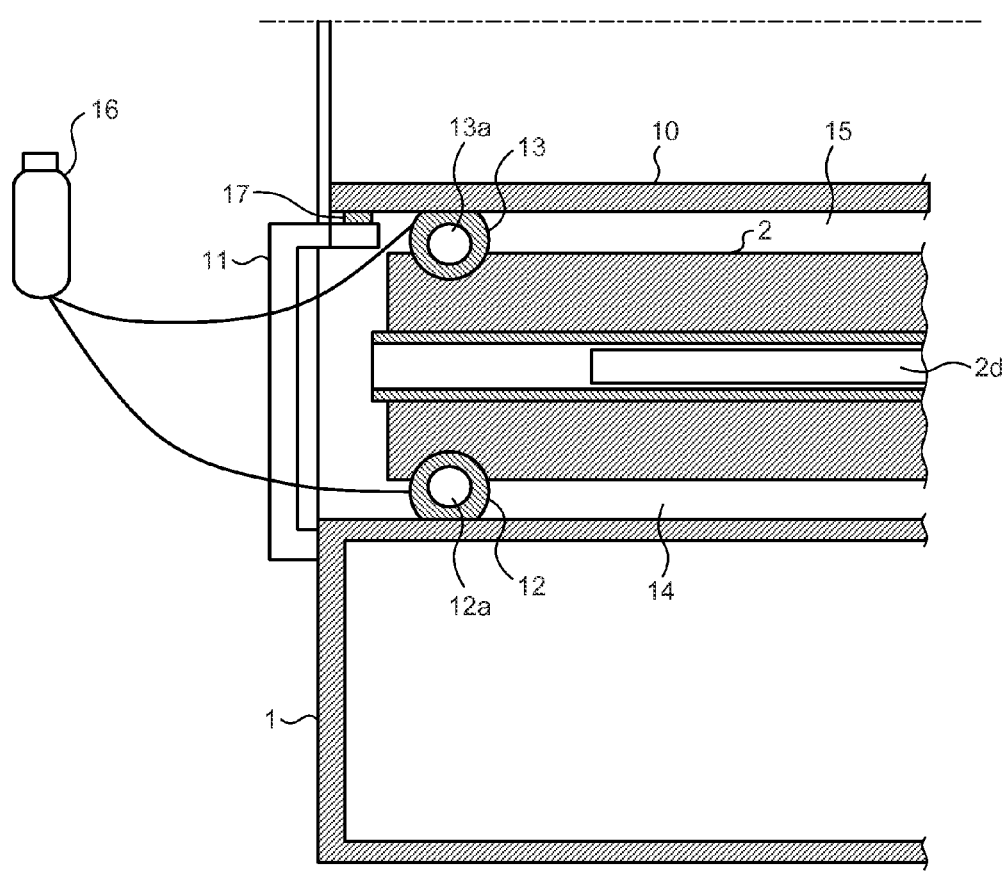
FIG. 5 is a cross-sectional view to illustrate structures of the magnetostatic field magnet, gradient coil, and the bore tube, near lateral ends thereof, according to the first embodiment.

It is also possible to provide the MRI apparatus 100 according to the first embodiment with an adjusting means for adjusting the pressures in the hollows of the elastic members. FIG. 5 is a cross-sectional view to illustrate structures of the magnetostatic field magnet, the gradient coil, and the bore tube, near lateral ends thereof, according to the first embodiment. For example, the MRI apparatus 100 according to the first embodiment may include an accumulator 16, as illustrated in FIG. 5. As illustrated in FIG. 5, the accumulator 16 is connected to each of the elastic members 12 and 13 and is configured to adjust the internal pressure in each of the hollows 12a and 13a. In this situation, although FIG. 5 illustrates that only the elastic members 12 and 13 provided on one end are connected to the accumulator 16, the elastic members 12 and 13 on both ends are connected to the accumulator 16 in actuality.

In an example, the accumulator 16 may further be connected to the computer system 9, so as to adjust the internal pressure in each of the hollows 12a and 13a in accordance with the image taking status. As a result, for example, when an image taking process is to be performed for the purpose of determining a position or screening, the accumulator 16 makes adjustments so as to lower the internal pressures in the hollows 12a and 13a. As a result, the elastic members 12 and 13 become more flexible. It is therefore possible to further reduce the propagation of the vibrations and to better suppress the occurrence of the noise. In contrast, when a main image taking process is to be performed for diagnosis purposes, the accumulator 16 makes adjustments so as to raise the internal pressures in the hollows 12a and 13a. As a result, the elastic members 12 and 13 maintain a certain level of hardness. It is therefore possible to inhibit image degradations.

In another example, it is also possible to configure the MRI apparatus 100 according to the first embodiment so that, as illustrated in FIG. 5, a vibration preventing member 17 is disposed between the bore tube 10 and the bore tube supporting unit 11. In this situation, the vibration preventing member 17 is a member formed by using an elastic material such as rubber, for example. With this configuration, it is possible to prevent the vibrations propagated from the gradient coil 2 to the magnetostatic field magnet 1 from propagating to the bore tube 10 via the bore tube supporting unit 11.

It is possible to configure each of the elastic members 12 and 13 according to the first embodiment so as to have hollows therein that are in an arbitrary quantity and are in arbitrary shapes. FIGS. 6A to 6D are cross-sectional views to illustrate exemplary structures of the hollows of the elastic members according to the first embodiment. Although FIGS. 6A to 6D illustrate only one of the elastic members 12, it is possible to apply any of the structures illustrated in FIGS. 6A to 6D to the elastic members 13.

Figure 6A:
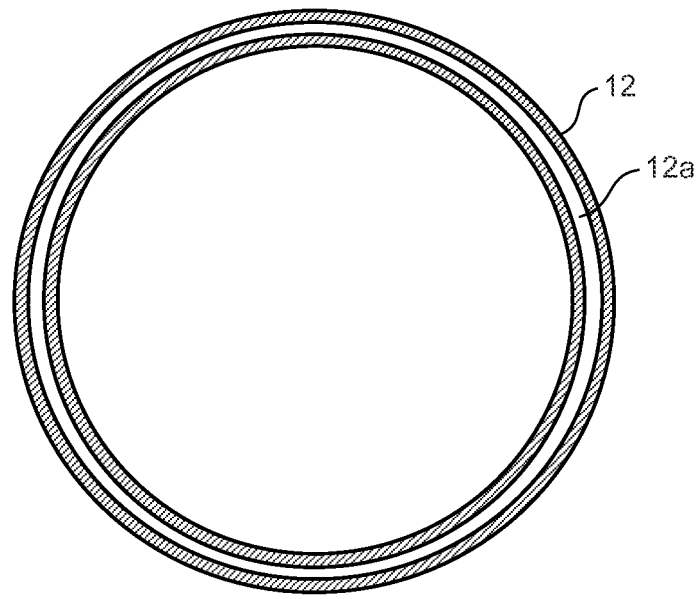
FIG. 6A is a cross-sectional view to illustrate an exemplary structure of a hollow of an elastic member according to the first embodiment.
Figure 6B:
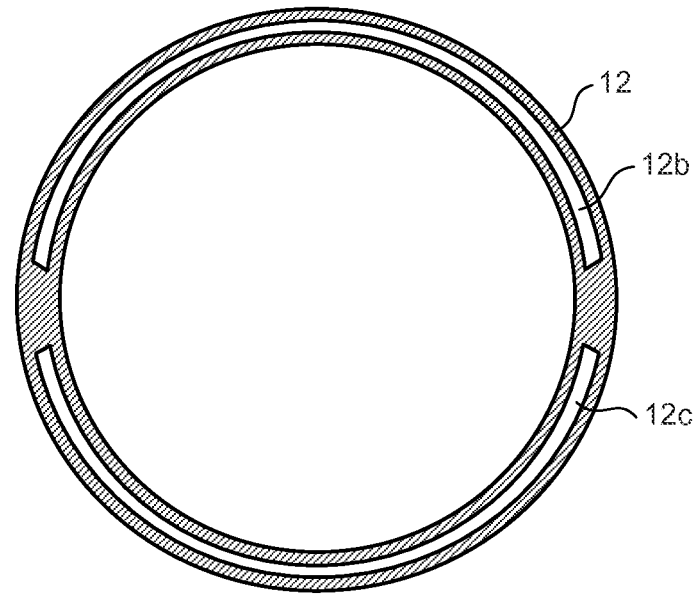
FIG. 6B is a cross-sectional view to illustrate another exemplary structure of the hollow of the elastic member according to the first embodiment.

For example, as illustrated in FIG. 6A, each of the elastic members 12 according to the first embodiment may have formed therein one hollow 12a of which the width is regular. In one example, each of the annular-shaped elastic members 12 may have formed therein an annular-shaped hollow 12a of which the diameter is regular in any cross section. Alternatively, each of the elastic members 12 according to the first embodiment may have formed therein a plurality of hollows. For example, as illustrated in FIG. 6B, each of the elastic members 12 may have formed therein two hollows (i.e., hollows 12b and 12c) of which the width is regular. It should be noted that the quantity of hollows may arbitrarily be selected and may be three or more.

Figure 6C:
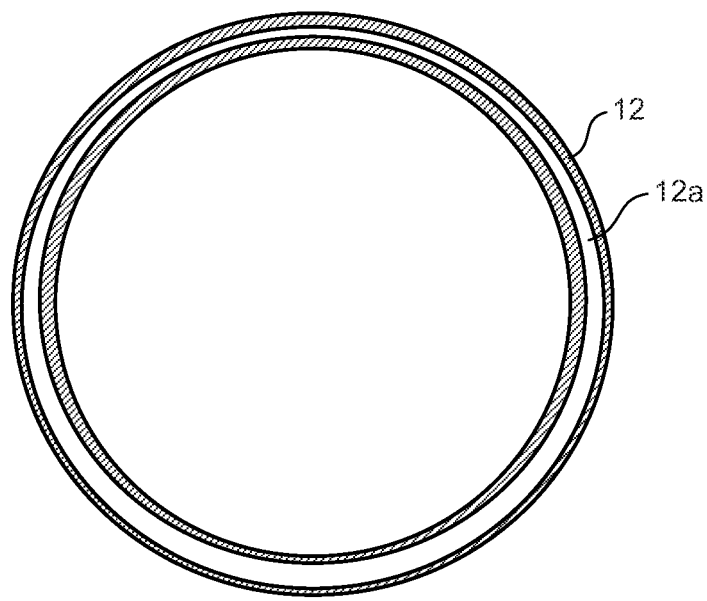
FIG. 6C is a cross-sectional view to illustrate yet another exemplary structure of the hollow of the elastic member according to the first embodiment.
Figure 6D:
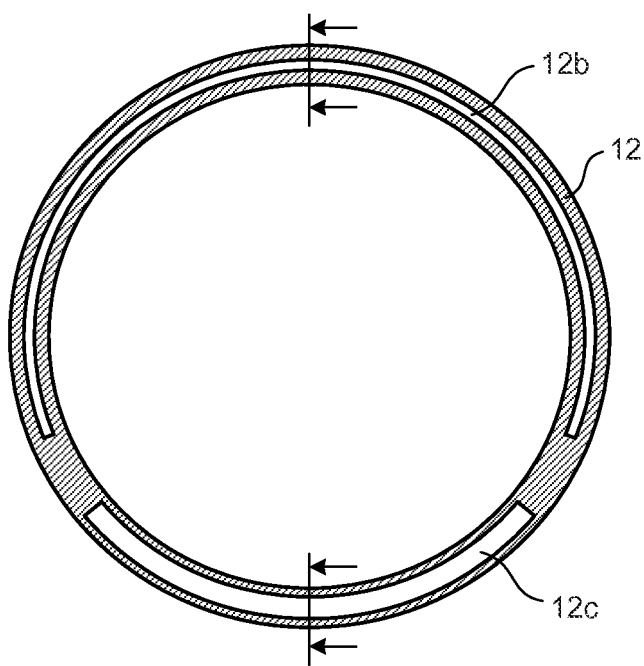
FIG. 6D is a cross-sectional view to illustrate yet another exemplary structure of the hollow of the elastic member according to the first embodiment.

In yet another example, each of the elastic members 12 according to the first embodiment may have formed therein a hollow of which the width partially varies. For example, as illustrated in FIG. 6C, each of the elastic members 12 according to the first embodiment may have formed therein a hollow 12a of which the width is smaller in the upper part of the elastic member 12 and of which the width becomes larger toward the lower part of the elastic member 12. In yet another example, each of the elastic members 12 according to the first embodiment may have formed therein a plurality of hollows of which the widths are different from one another. For example, as illustrated in FIG. 6D, each of the elastic members 12 according to the first embodiment may have formed therein a hollow 12b that has a smaller width and a hollow 12c that has a larger width. Even in an example where the quantity of hollows is three or more, the width of each of the hollows may arbitrarily be designed.

Figure 6E:
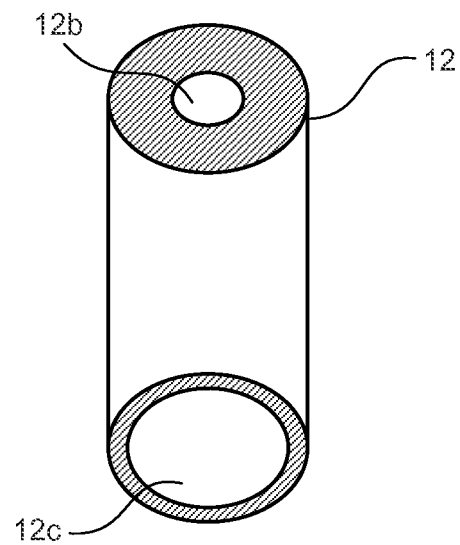
FIG. 6E is a cross-sectional view to illustrate an exemplary structure of the elastic member according to the first embodiment.
Figure 6F:
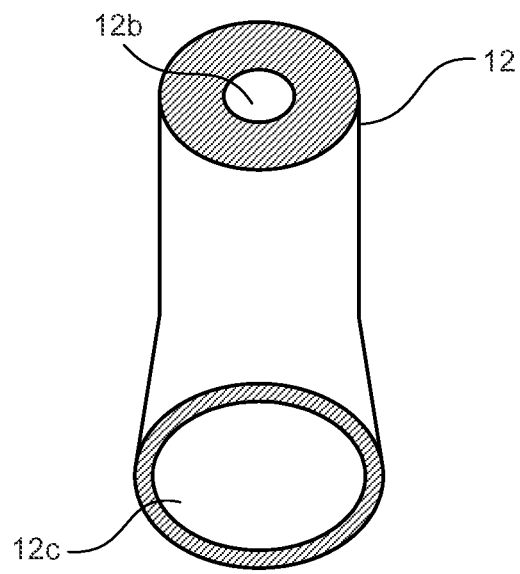
FIG. 6F is a cross-sectional view to illustrate another exemplary structure of the elastic member according to the first embodiment.

Further, each of the elastic members 12 according to the first embodiment may be designed to have an arbitrary cross-sectional dimension. FIGS. 6E and 6F are cross-sectional views to illustrate exemplary structures of the elastic member according to the first embodiment. FIGS. 6E and 6F illustrate cross-sectional views of the elastic member shown in FIG. 6D, the cross section being taken at the positions indicated with arrows. Although FIGS. 6E and 6F illustrate only one of the elastic members 12, it is possible to apply any of the structures illustrated in FIGS. 6E and 6F to the elastic members 13.

For example, as illustrated in FIG. 6E, each of the elastic members 12 according to the first embodiment may be formed to have a cross-sectional dimension that is regular along the circumferential direction of the annular structure and may have formed therein a hollow of which the width varies. In yet another example, each of the elastic members 12 according to the first embodiment may be formed to have a cross-sectional dimension that varies in accordance with the width of the hollow formed therein. For example, as illustrated in FIG. 6F, each of the elastic members 12 according to the first embodiment may be formed to have a smaller cross-sectional dimension in the part where the width of the hollow is smaller and to have a larger cross-sectional dimension in the part where the width of the hollow is larger.

Figure 7:
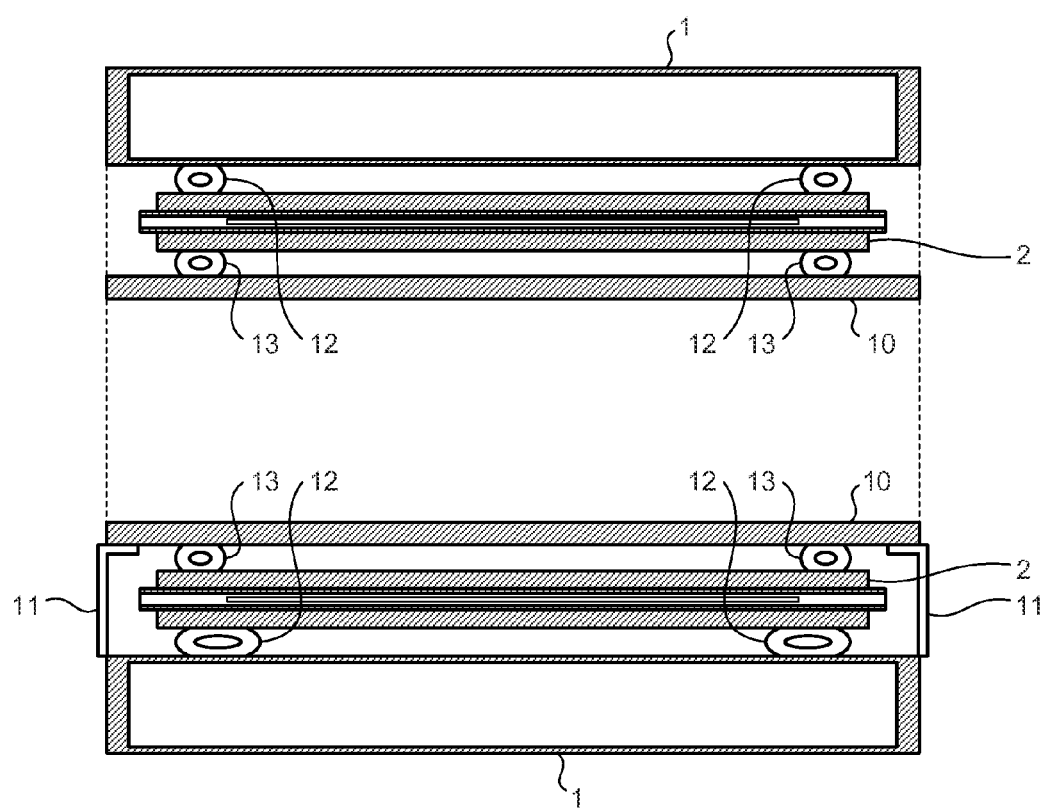
FIG. 7 is a cross-sectional view to illustrate an exemplary supporting structure of the elastic members according to the first embodiment.

As described above, it is possible to arbitrarily design the elastic members 12 according to the first embodiment with regard to the quantity and the shapes of the hollows as well as the cross-sectional dimension of the elastic members. Consequently, the elastic members 12 according to the first embodiment are able to adjust the supports for the loads of the gradient coil 2 and the bore tube 10. FIG. 7 is a cross-sectional view to illustrate an exemplary supporting structure of the elastic members according to the first embodiment. FIG. 7 illustrates an example in which the elastic member shown in FIG. 6D is used as each of the elastic members 12, while the hollows 12c having a larger width is arranged on the lower side of the gradient coil 2, and the internal pressures in the hollows 12b and 12c are arranged to be regular. In this situation, as illustrated in FIG. 7, for example, each of the elastic members 12 is able to support the gradient coil 2 in a wider area in the lower side thereof where the load from the gradient coil 2 is applied.

As explained above, according to the first embodiment, the annular-shaped elastic members 12 and 13 of which the strengths can arbitrarily be adjusted by changing the internal pressures in the hollows thereof are disposed on the outer circumferential side and the inner circumferential side of the gradient coil that is a source of the vibrations. Consequently, the MRI apparatus 100 is able to reduce the propagation of the vibrations through the solids. Further, according to the first embodiment, because the elastic members that are flexible are used, the magnetic resonance imaging apparatus 100 is able to enhance the sealing capability and is therefore able to further eliminate the propagation of the vibrations through the air. Furthermore, according to the first embodiment, it is possible to shorten the length of the gantry of the magnetic resonance imaging apparatus 100. Consequently, the magnetic resonance imaging apparatus 100 according to the first embodiment is able to improve the silencing capability and further makes it possible to enhance the feeling of openness for the subject.

In addition, according to the first embodiment, the hollows of the elastic members 12 and 13 can be formed therein, in an arbitrary quantity and in arbitrary shapes. Consequently, the magnetic resonance imaging apparatus 100 according to the first embodiment is able to freely adjust the degree by which each of the elastic members 12 is in close contact with the gradient coil 2 and the magnetostatic field magnet 1 and the degree by which each of the elastic members 13 is in close contact with the gradient coil 2 and the bore tube 10. The magnetic resonance imaging apparatus 100 thus makes it possible to further reduce the propagation of the vibrations through the solids and through the air. In addition, the magnetic resonance imaging apparatus 100 according to the first embodiment makes it possible to freely adjust the supports for the gradient coil 2 and the bore tube 10.

Further, according to the first embodiment, the elastic members 12 and 13 are formed to have an arbitrary cross-sectional dimension. Accordingly, the magnetic resonance imaging apparatus 100 according to the first embodiment is able to more freely adjust the degree by which each of the elastic members 12 is in close contact with the gradient coil 2 and the magnetostatic field magnet 1 and the degree by which each of the elastic members 13 is in close contact with the gradient coil 2 and the bore tube 10. The magnetic resonance imaging apparatus 100 thus makes it possible to further reduce the propagation of the vibrations through the solids and through the air. In addition, the magnetic resonance imaging apparatus 100 according to the first embodiment makes it possible to more freely adjust the supports for the gradient coil 2 and the bore tube 10.

Furthermore, according to the first embodiment, the accumulator 16 is configured to adjust the internal pressures in the hollows 12a and 13a of the elastic members 12 and 13. Consequently, the magnetic resonance imaging apparatus 100 according to the first embodiment makes it possible to freely control the internal pressures in the hollows 12a and 13a, in accordance with various types of conditions such as the image taking condition.

Figure 8:
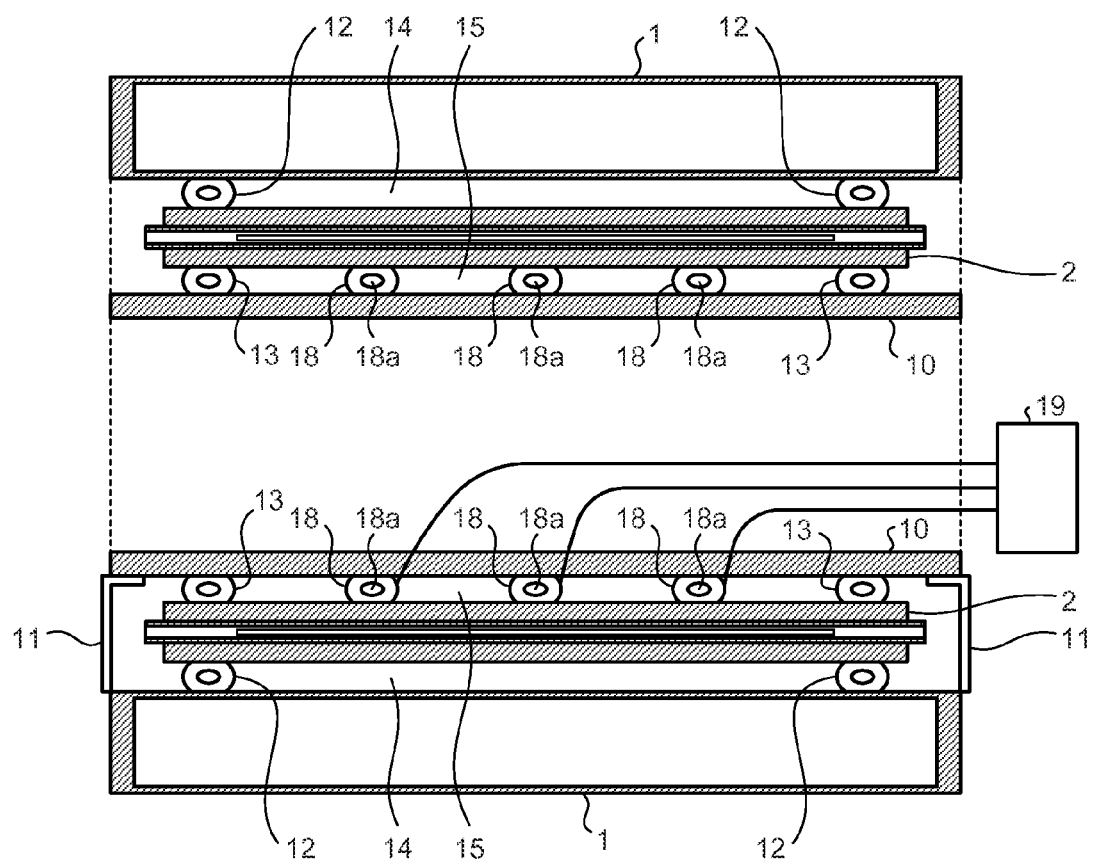
FIG. 8 is a cross-sectional view to illustrate structures of a magnetostatic field magnet, a gradient coil, and a bore tube according to a second embodiment.

Next, a second embodiment will be explained. In the second embodiment, an example will be explained in which vibration suppressing elastic members are disposed as second elastic members in the hermetically-sealed space 15 described in the first embodiment. FIG. 8 is a cross-sectional view to illustrate structures of the magnetostatic field magnet 1, the gradient coil 2, and the bore tube 10 according to the second embodiment. In the second embodiment, some of the constituent elements that are the same as those previously illustrated in the drawings will be referred to by using the same reference characters, and the explanation thereof will be omitted.

Vibration suppressing elastic members 18 are each loop-shaped and hollow and are disposed in the hermetically-sealed space formed by the elastic members 12 and 13. For example, as illustrated in FIG. 8, the vibration suppressing elastic members 18 that are each annular-shaped and hollow are disposed in the hermetically-sealed space 15 formed by the elastic members 13. The vibration suppressing elastic members 18 each have the same structure as that of each of the elastic members 12 and 13. More specifically, as illustrated in FIG. 6A to 6D, each of the vibration suppressing elastic members 18 has one or more hollows 18a formed therein that are in an arbitrary quantity and are in arbitrary shapes. Further, as illustrated in FIGS. 6E and 6F, each of the vibration suppressing elastic members 18 is designed to have an arbitrary cross-sectional dimension. Liquid such as water or oil or gas such as air or any other type of gas is put into the hollows 18a, and a predetermined level of internal pressure is applied thereto.

In this situation, when the hermetically-sealed space 15 is made into a vacuum, grooves are formed in the gradient coil 2 in such parts against which the vibration suppressing elastic members 18 abut. Thus, the ends of the vibration suppressing elastic members 18 positioned on the gradient coil 2 side engage with the grooves. In contrast, when the hermetically-sealed space 15 is not made into a vacuum, it is not necessary to form any grooves in the gradient coil 2.

Further, as illustrated in FIG. 8, the vibration suppressing elastic members 18 are connected to a pump (not shown) via a valve unit 19, so that the internal pressures in the hollows 18a are adjusted. The valve unit 19 includes a plurality of valves used for arbitrarily adjust the internal pressure in each of the hollows 18a of the vibration suppressing elastic members 18. In other words, the plurality of valves included in the valve unit 19 are connected to the hollows 18a of the vibration suppressing elastic members 18 in a one-to-one correspondence. Further, by opening only the valve connected to such one of the hollows 18a of which the internal pressure needs to be adjusted, the valve unit 19 is able to adjust the internal pressure only in that hollow 18a.

In this situation, the valve unit 19 according to the second embodiment is connected to the computer system 9 and is able to open and close the valves, under control of the computer system 9. Further, for example, the computer system 9 adjusts the pressure in the hollows 18a of the vibration suppressing elastic members 18, in accordance with a vibration frequency generated according to a pulse sequence. In that situation, for example, the computer system 9 stores therein, in advance, a table in which vibration frequencies are kept in correspondence with internal pressures in each of the hollows 18a of the vibration suppressing elastic members 18, for each image taking sequence. Further, in accordance with an image taking sequence that is currently being executed, the computer system 9 adjusts the internal pressures in the hollows 18a of each of the vibration suppressing elastic members 18.

Generally speaking, the vibration frequency of the gradient coil 2 varies among different image taking sequences. Further, when the vibration frequency in an image taking sequence is close to the natural frequency of the material of which the bore tube 10 is made, a resonance occurs. As a result, the bore tube 10 vibrates, and the noise increases. To cope with this situation, the MRI apparatus 100 according to the second embodiment has the structure described above and is thus able to reduce the noise by suppressing the vibrations of the bore tube 10. In an example, the computer system 9 stores therein a table in which each of the positions where a resonance occurs in the bore tube 10 (i.e., the antinode positions where the vibrations are mutually intensified) is kept in correspondence with one of the vibration suppressing elastic members 18 positioned adjacent to the resonance-occurring position, for each image taking sequence. Further, by raising the internal pressures in the one or more hollows 18a of the vibration suppressing elastic member 18 that corresponds to the image taking sequence currently being executed, the computer system 9 holds the bore tube 10 and suppresses the vibrations.

According to the second embodiment, it is possible to arbitrarily change the natural frequency of the bore tube 10 in accordance with the vibration frequency generated according to the image taking sequence.

The first and the second embodiments have thus been described. It is, however, possible to carry out the present disclosure in various modes other than the first and the second embodiments described above.

In the first and the second embodiments described above, the examples are explained in which the magnetostatic field magnet 1, the gradient coil 2, and the bore tube 10 are each in the shape of a substantially circular cylinder. However, possible embodiments are not limited to these examples. The magnetostatic field magnet 1, the gradient coil 2, and the bore tube 10 may each have any arbitrary shape. For example, the gradient coil 2 may be in the shape of an elliptic cylinder. In that situation, the shape of each of the elastic members 12 and 13 and the vibration suppressing elastic members 18 is arranged to fit the shapes of the magnetostatic field magnet 1, the gradient coil 2, and the bore tube 10.

More specifically, in the first and the second embodiments described above, the examples are explained in which the loop of each of the elastic members 12 and 13 and the vibration suppressing elastic members 18 is circular. However, possible embodiments are not limited to these examples. It is possible to arbitrarily design the shape of the loop of each of the elastic members 12 and 13 and the vibration suppressing elastic members 18 so as to fit the shapes of the magnetostatic field magnet 1, the gradient coil 2, and the bore tube 10. For example, if the magnetostatic field magnet 1, the gradient coil 2, and the bore tube 10 are each in the shape of an elliptical cylinder, the shape of the loop of each of the elastic members 12 and 13 and the vibration suppressing elastic members 18 is arranged to be elliptic so as to be in close contact with the magnetostatic field magnet 1, the gradient coil 2, and the bore tube 10.

Further, in the first and the second embodiments described above, the examples are explained in which each of the elastic members has a circular cross-sectional shape (see FIG. 3A, for example) in a cross section of the loop. However, possible embodiments are not limited to these examples. For instance, it is also acceptable to use elastic members each having a rectangular cross-sectional shape.

In the first and the second embodiments described above, the examples are explained in which the elastic members 12 and the elastic members 13 are provided. However, possible embodiments are not limited to these examples. For example, it is acceptable to provide only the elastic members 12 or only the elastic members 13. In an example, it is acceptable to arrange the gradient coil 2 to be supported by the conventional gradient coil supporting unit, instead of by the elastic members 12.

Further, in the first and the second embodiments described above, the examples are explained in which each of the elastic members 12 and 13 and the vibration suppressing elastic members 18 is loop-shaped and hollow. However, possible embodiments are not limited to these examples. The elastic members do not have to be hollow. More specifically, elastic members may be disposed, in the manner of loops, on at least one selected from: the outer circumferential side of the gradient coil 2 and the outer circumferential side of the bore tube 10. In an example, the hermetically-sealed space 14 may be formed by disposing the elastic members 12 that do not have the hollows 12a on both ends of the magnetostatic field magnet 1 and the gradient coil 2. Further, the hermetically-sealed space 15 may be formed by disposing the elastic members 13 that do not have the hollows 13a on both ends of the gradient coil 2 and the bore tube 10.

By using a magnetic resonance imaging apparatus according to at least one aspect of the embodiments described above, it is possible to improve the silencing capability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a magnetostatic field magnet that is formed in a shape of a cylinder and generates a magnetostatic field in a space inside the cylinder;
a gradient coil that is formed in a shape of a cylinder, is disposed in the cylinder of the magnetostatic field magnet, and applies a gradient magnetic field to the magnetostatic field;
a bore tube that is formed in a shape of a cylinder and is disposed in the cylinder of the gradient coil;
an elastic member that is loop-shaped and hollow, is disposed in at least one selected from: a space between an inner circumferential side of the magnetostatic field magnet and an outer circumferential side of the gradient coil; and a space between an inner circumferential side of the gradient coil and an outer circumferential side of the bore tube, and thereby seals the space hermetically; and an adjusting unit that adjusts a pressure inside the hollow of the elastic member in accordance with an imaging sequence.

2. The magnetic resonance imaging apparatus according to claim 1, further comprising: a vibration suppressing elastic member that is loop-shaped and hollow and is disposed in the hermetically-sealed space formed by the elastic member, wherein the adjusting unit adjusts the pressure inside the hollow of the elastic member and a pressure inside the hollow of the vibration suppressing elastic member, each to a predetermined level.

3. The magnetic resonance imaging apparatus according to claim 2, wherein the adjusting unit adjusts the pressure inside the hollow of the vibration suppressing elastic member in accordance with a vibration frequency generated according to a pulse sequence.

4. The magnetic resonance imaging apparatus according to claim 1, wherein the elastic member forms a hermetically-sealed space that covers surroundings of the gradient coil, without providing any end plates configured to fix one or both ends of the magnetostatic field magnet and one or both ends of the bore tube.

5. A magnetic resonance imaging apparatus comprising:

a magnetostatic field magnet that is formed in a shape of a cylinder and generates a magnetostatic field in a space inside the cylinder;

a gradient coil that is formed in a shape of a cylinder, is disposed in the cylinder of the magnetostatic field magnet, and applies a gradient magnetic field to the magnetostatic field;

a bore tube that is formed in a shape of a cylinder and is disposed in the cylinder of the gradient coil;

an elastic member that is disposed, in a manner of a loop, on at least one selected from: an outer circumferential side of the gradient coil; and an outer circumferential side of the bore tube; and an adjusting unit that adjusts a pressure inside the hollow of the elastic member in accordance with an imaging sequence.

* * * * *